Figure 1:
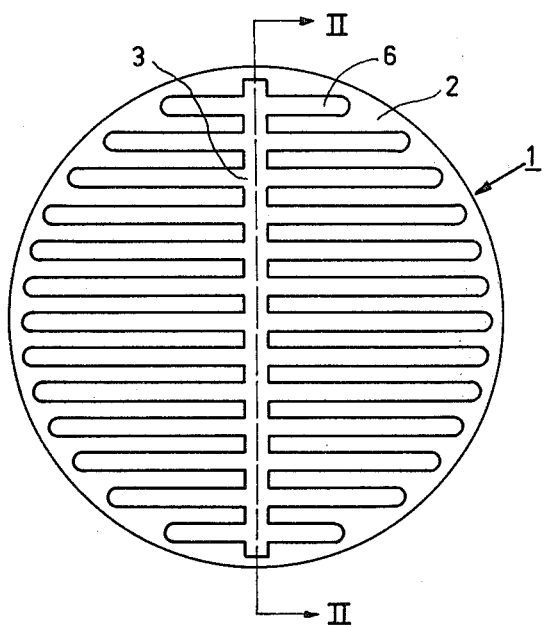

United States Patent [19]

van Mourik

[11] 4,336,281
[45] Jun. 22, 1982

[54] METHOD OF MANUFACTURING A SOLAR CELL

[75] Inventor: Jacobus H. C. van Mourik, Eindhoven, Netherlands

[73] Assignee: U.S. Philips Corporation, New York, N.Y.

[21] Appl. No.: 171,693

[22] Filed: Jul. 24, 1980

[30] Foreign Application Priority Data

Jul. 27, 1979 [NL] Netherlands .......................... 7905817

[51] Int. Cl.³ ......................... B05D 3/04; B05D 3/10; B05D 3/12
[52] U.S. Cl. ..................................... 427/74; 136/256; 427/75
[58] Field of Search ..................... 427/74, 75; 136/256

[56] References Cited

U.S. PATENT DOCUMENTS 4,165,241 8/1979 Yerkes et al. ...................... 427/75 X

OTHER PUBLICATIONS

Haigh, "Fired Through Printed Contacts on Antireflection Coated Silicon Terrestial Solar Cells," Conf. Record, 12th IEEE Photovoltaic Specialists Conference, Nov. 15-18, 1976.

Frisson et al., "Screen Printed Contacts on Silicon Solar Cells with Low Series Resistance," Conf. Record, 13th IEEE Photovoltaic Specialists Conference, Jun. 5-8, 1978.

*Primary Examiner*—James R. Hoffman
*Attorney, Agent, or Firm*—Paul R. Miller

[57] ABSTRACT

A method of manufacturing a solar cell comprising a silicon disc having a region of the n-conductivity type adjoining a major surface, in which an electrode containing silver is provided on the n-type region by means of a silk-screening process, characterized in that during the silk-screening process a paste is used which, in addition to silver, contains an addition in an elementary form, which addition belongs to the group of elements consisting of bismuth, magnesium and indium, that after providing the electrode a thermal treatment in an oxidizing atmosphere is carried out, and that the electrode is then subjected to a chemical or mechanical treatment to improve the junction resistance with the silicon.

14 Claims, 2 Drawing Figures

METHOD OF MANUFACTURING A SOLAR CELL

The invention relates to a method of manufacturing a solar cell comprising a silicon disc having a region of the n-conductivity type which adjoins a major surface, in which an electrode comprising silver is provided on the n-type region by means of a silk-screening process.

Such a method is known from the Conference Record of the 12th IEEE Photovoltaic Specialists Conference 1976, pp. 303–308.

Due to its simplicity, the provision of electrodes on a silicon disc to obtain a solar cell by silk-screening is to be preferred over known vapour deposition methods which in themselves give good results.

It has been found, however, that silver electrodes obtained by silk-screening often adhere insufficiently to silicon and thus provide poor electrical contacts.

One of the objects of the invention is to avoid these problems at least to a considerable extent. The invention is based inter alia on the recognition of the fact that both by additions to the silver and by adapted treatment of silver electrodes obtained by silk-screening the electrical contact of the silver electrodes can be considerably improved.

According to the invention, the method mentioned in the opening paragraph is therefore characterized in that during this silk-screening process a paste is used which, in addition to silver, comprises an addition in an elementary form, which addition belongs to the group of elements consisting of bismuth, magnesium and indium, that after the provision of the electrode a thermal treatment is carried out in an oxidizing atmosphere, and that the electrode is then subjected to a chemical or mechanical treatment to improve the junction resistance with the silicon.

The elements do not vary or do not substantially vary the electric conductivity or the conductivity type of the contacted silicon.

The temperature of the thermal treatment is between approximately 550° and 700° C. The same temperatures are used if an aluminium-containing silver electrode is provided on a p-type substrate of the disc. An advantage of the method according to the invention is that the thermal treatments of the two electrodes can be combined.

Bismuth is preferably used as an addition.

The thermal treatment may be carried out in air. In the case of a thermal treatment in exclusively nitrogen, for example, the adhesion of the electrode to the major surface and hence the electrical contact is insufficient or is absent.

The junction resistance of the electrode to the silicon is considerably reduced by mechanical treatment, for example, by scouring, or chemical treatment, preferably with a soda solution.

Solar cells obtained by means of the method according to the invention have electrical and mechanical properties which are comparable to those of solar cells having electrodes obtained by vapour deposition.

The invention will now be described in greater detail, by way of example, with reference to an embodiment and the accompanying drawing.

Figure 2:
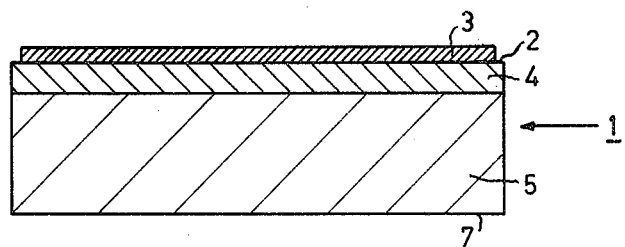

FIG. 1 of the drawing is a diagrammatic plan view of a solar cell in a stage of the manufacture by means of the method according to the invention and FIG. 2 is a diagrammatic cross-sectional view taken on the line II—II of FIG. 1.

In the example a solar cell is manufactured comprising a silicon disc 1 (see FIGS. 1 and 2) having a region 4 of the n-conductivity type adjoining a major surface 2.

An electrode 3 containing silver is provided on the n-type region by means of a silk-screening process.

According to the invention, in the silk-screening process a paste is used which, in addition to silver, comprises an addition in an elementary form belonging to the group consisting of bismuth, magnesium and indium.

After providing the electrode 3, a thermal treatment in an oxidizing atmosphere is carried out and the electrode 3 is then subjected to a chemical or mechanical treatment to improve the junction resistance with the silicon.

Starting material in the manufacture is, for example, a p-type silicon body 5 having a diameter of approximately 5 cm and a thickness of 0.3 mm and a resistivity of 2 ohm.cm.

The body 5 is provided in the usual manner with a 0.3–0.5 $\mu$m thick n-type epitaxial layer which forms the region 4.

A comb-shaped electrode 3 is formed on the major surface 2 by means of a usual silk-screening process. Teeth 6 of the comb 3 are, for example, 300 $\mu$m wide and are spaced apart at a mutual distance of 0.3 cm.

The paste used in the silk-screening process contains 80 g of silver suspended in 20 g of binder, for example, ethyl cellulose dissolved in, for example, terpineol. Bismuth is preferably used as an addition. Very satisfactory results are obtained when the bismuth concentration is between 0.5 and 15% by weight of the weight of silver and preferably between 1 and 2% by weight.

A thermal treatment of the silicon disc is then carried out for 10 minutes at 630° C. in air.

As a mechanical treatment the electrode is then scoured manually for 10 seconds by means of fine steel wool.

Steel particles, if any, remaining on the electrode surface can be removed simply by rinsing with water.

The effect of the method according to the invention can be measured by making a cross-section through the silicon disc with the electrodes normal to the teeth 6 of the electrode 3 in such manner that 1 cm long not-interconnected comb portions are present on the part of the disc.

The resistance between adjacent parts of the comb are determined by the very small and known resistance of the silver electrodes, by the resistance of the junctions of the silver electrodes to the silicon disc and by the resistance of the silicon.

The resistance is now measured between an extreme part of the comb and other parts of the comb as a function of the distance to the first mentioned part of the comb. By exterpolation in accordance with distance equal to zero, the junction resistance of the electrode to the silicon can be determined and the resistance of the silicon can be determined from the inclination of the resistance as a function of the distance.

It has been found that by means of the method according to the invention the resistance of the silicon does not or substantially does not vary but that the junction resistance between the electrode and the silicon disc decreases by an order of magnitude, for example, from 20 to 40 ohm to 2 to 3 ohm.

The method according to the invention is not restricted to the embodiment described. Instead of bismuth, indium or magnesium may be used, by means of pastes which contain these elements in a concentration of 2% by weight of the weight of silver.

Instead of the scouring treatment to improve the junction resistance, another mechanical treatment or a chemical treatment may be used, for example, a treatment with an aqueous solution of 10% by weight of sodium carbonate for 3 minutes at 90° C.

The major surface 7 situated opposite to the major surface 2 may also be provided with an electrode by means of silk-screening. For example, a paste is used in this case which in addition to silver contains aluminium as an addition.

The silicon disc with electrodes can be processed in a usual manner to form a solar cell.

What is claimed is:

1. A method of manufacturing a solar cell having a silicon disc with a region of n-conductivity type adjoining a major surface comprising the steps of forming an electrode containing silver on said n-type region in a silk-screening process by using a paste containing silver and an addition in elementary form belonging to the group of elements consisting of bismuth, magnesium and indium; carrying out a thermal treatent in an oxidizing atmosphere after forming said electrode; and thereafter subjecting said electrode to a mechanical treatment by a scouring treatment to improve junction resistance with said silicon.

2. A method according to claim 1, wherein said scouring is carried out by applying fine steel wool.

3. A method according to claim 1, wherein bismuth is used as said addition.

4. A method according to claim 3, wherein said bismuth has a concentration of between 0.5 and 15% by weight of silver.

5. A method according to claim 4, wherein said concentration of bismuth is between 1 and 2% by weight.

6. A method according to claim 1, wherein at least one of magnesium or indium is used as said addition in an amount of approximately 2% by weight of silver.

7. A method according to claim 1, wherein said thermal treatment is carried out at a temperature between approximately 550° and 700° C.

8. A method of manufacturing a solar cell having a silicon disc with a region of n-conductivity type adjoining a major surface comprising the steps of forming an electrode containing silver on said n-type region in a silk-screening process by using a paste containing silver and an addition in elementary form belonging to the group of elements consisting of bismuth, magnesium, and indium; carrying out a thermal treatment in an oxidizing atmosphere after forming said electrode; and thereafter subjecting said electrode to a chemical treatment with a soda solution to improve junction resistance with said silicon.

9. A method according to claim 8, wherein said chemical treatment includes a treatment with an aqueous solution of 10% by weight of sodium carbonate for 3 minutes at 90° C.

10. A method according to claim 8, wherein bismuth is used as said addition.

11. A method according to claim 10, wherein said bismuth has a concentration of between 0.5 and 15% by weight of silver.

12. A method according to claim 11, wherein said concentration of bismuth is between 1 and 2% by weight.

13. A method according to claim 8, wherein at least one of magnesium or indium is used as said addition in an amount of approximately 2% by weight of silver.

14. A method according to claim 8, wherein said thermal treatment is carried out at a temperature between approximately 550° and 700° C.

* * * * *